US007904135B2

(12) United States Patent
Menezes et al.

(10) Patent No.: US 7,904,135 B2
(45) Date of Patent: Mar. 8, 2011

(54) MAGNETIC RESONANCE SPATIAL RISK MAP FOR TISSUE OUTCOME PREDICTION

(75) Inventors: Nina Menezes, Boston, MA (US); Alma Gregory Sorensen, Lexington, MA (US)

(73) Assignee: General Hospital Corporation, Boston, MA (US)

( * ) Notice: Subject to any disclaimer, the term of this patent is extended or adjusted under 35 U.S.C. 154(b) by 997 days.

(21) Appl. No.: 11/417,769

(22) Filed: May 4, 2006

(65) Prior Publication Data
US 2007/0167727 A1    Jul. 19, 2007

Related U.S. Application Data

(60) Provisional application No. 60/678,434, filed on May 6, 2005.

(51) Int. Cl.
*A61B 5/05* (2006.01)
(52) U.S. Cl. ....................................................... 600/410
(58) Field of Classification Search .................. 702/181; 600/410, 411, 419, 420
See application file for complete search history.

(56) References Cited

U.S. PATENT DOCUMENTS

| 6,295,465 | B1 | 9/2001 | Simonetti |
| 6,546,275 | B2 | 4/2003 | Carroll |
| 6,807,441 | B2 | 10/2004 | Schmainda |
| 2004/0127799 | A1 | 7/2004 | Sorensen et al. |

FOREIGN PATENT DOCUMENTS

| WO | WO 01/56466 A2 | * | 8/2001 |
| WO | WO 2004/040437 A1 | * | 5/2004 |

OTHER PUBLICATIONS

Ona Wu et al; Predicting Tissue Outcome in Acute Human Cerebral Ischemia Using Combined Diffusion and Perfusion-Weighted MR Imaging; LStroke, Journal of The American Heart Association; vol. 32, No. 4, Apr. 2001, pp. 933-942.

* cited by examiner

*Primary Examiner* — Brian Casler
*Assistant Examiner* — Elmer Chao
(74) *Attorney, Agent, or Firm* — Quarles & Brady, LLP; Thomas J. Krumenacher

(57) ABSTRACT

Diffusion weighted images and perfusion weighted images are acquired with an MRI system and used to produce low b, DWI, ADC, CBV, CBF, and MTT images of brain tissues following an ischemic event. These MRI physiological measurements are input along with a spatial location measurement to a generalized linear model that predicts the outcome of tissues surrounding a lesion.

12 Claims, 5 Drawing Sheets

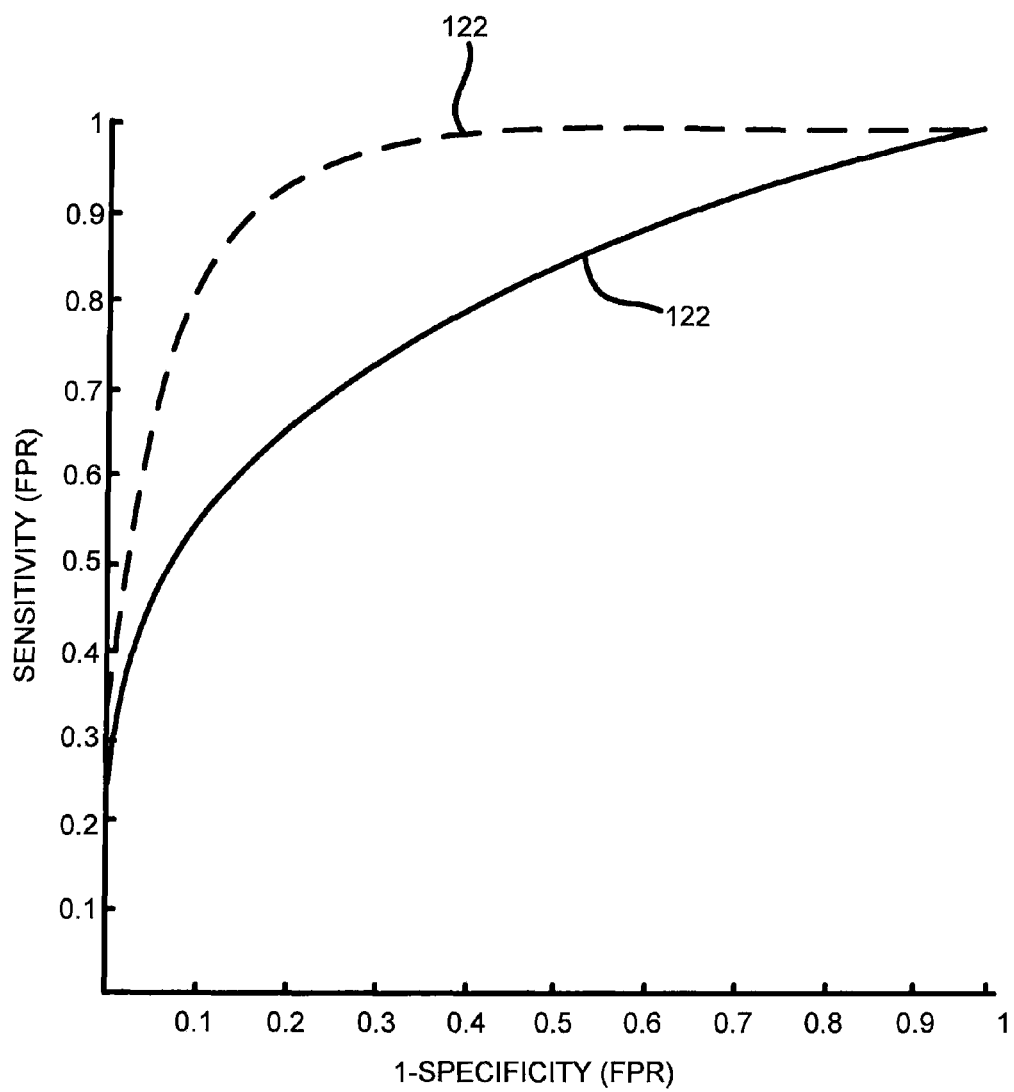

MAGNETIC RESONANCE SPATIAL RISK MAP FOR TISSUE OUTCOME PREDICTION

CROSS-REFERENCE TO RELATED APPLICATIONS

This application is based on U.S. Provisional patent application Ser. No. 60/678,434 filed on May 6, 2005 and entitled "Method For Predicting Tissue Outcome in Acute Human Stroke."

STATEMENT REGARDING FEDERALLY SPONSORED RESEARCH

This invention was made with government support under Grant No. 5R01NS038477-07 awarded by the National Institute of Health. The United States Government has certain rights in this invention.

BACKGROUND OF THE INVENTION

The field of the invention is nuclear magnetic resonance imaging (MRI) methods and systems. More particularly, the invention relates to MR imaging of the brain.

When a substance such as human tissue is subjected to a uniform magnetic field (polarizing field $B_0$), the individual magnetic moments of the spins in the tissue attempt to align with this polarizing field, but precess about it in random order at their characteristic Larmor frequency. If the substance, or tissue, is subjected to a magnetic field (excitation field $B_1$) which is in the x-y plane and which is near the Larmor frequency, the net aligned moment, Mz, may be rotated, or "tipped", into the x-y plane to produce a net transverse magnetic moment Mt. A signal is emitted by the excited spins after the excitation signal $B_1$ is terminated, this signal may be received and processed to form an image.

When utilizing these signals to produce images, magnetic field gradients ($G_x$, $G_y$ and $G_z$) are employed. Typically, the region to be imaged is scanned by a sequence of measurement cycles in which these gradients vary according to the particular localization method being used. The resulting set of received NMR signals are digitized and processed to reconstruct the image using one of many well known reconstruction techniques.

Magnetic resonance imaging currently plays an essential role in the diagnosis of stroke, both in distinguishing between hemorrhage and ischemia, and in determining the extent and localization of the lesion. Another important goal for patient management is prognosis. In terms of clinical decision-making regarding therapeutic options, the challenge of providing early prognosis in stroke can be broken down into two parts. First, how likely is the ischemic tissue to infarct in the absence of intervention? This is a problem of predicting tissue outcome. Second, if the ischemic tissue does infarct, how critical will the resulting cognitive and behavioral deficit be? This is problem of predicting clinical outcome. The goal, ultimately, is to improve stroke patient care, and to accomplish this will require the accurate prediction of tissue fate and the means to translate the prediction of tissue fate into one of clinical fate. Tools that accurately estimate both tissue and clinical outcome in the acute setting would dramatically impact patient care. For example, patients identified early on as having a good prognosis can be spared risky therapeutics. Conversely, early identification of poor prognosis will weight heavily in the decision of whether to use thrombolytics that carry a certain amount of risk.

There are many MR imaging techniques used to acquire diagnostic information from the brain. These include contrast enhanced $T_1$-weighted images that brightly reveal regions where the blood-brain barrier is destroyed, $T_2$-weighted fast-spin-echo (FSE) and fluid attenuated inversion-recovery (FLAIR) imaging which show the extent of edema surrounding a damaged region. Two of the most important diagnostic tools, however, are diffusion-weighted imaging (DWI) and perfusion-weighted imaging (PWI) which measure physiological parameters that correlate with tissue health.

Diffusion-weighted imaging (DWI) is a powerful MRI technique for probing microscopic tissue structure. In DWI, a pulse sequence is employed which contains a magnetic field gradient known as a diffusion gradient that sensitizes the MR signal to spin motion. In a DWI pulse sequence the detected MR signal intensity decreases with the speed of water diffusion in a given volume of tissue. The first moment of this diffusion gradient, also known as the "b-value" determines the speed of diffusion to which the image is sensitive. This b-value may be adjusted by either varying the area of the two lobes of the diffusion magnetic field gradient, or by varying the time interval between them. When water motion in the subject is unrestricted, the MR signal intensity at the center of the echo using a spin-echo diffusion-weighted pulse sequence is related to the b-value as follows:

$$A = \frac{S(b)}{S_0} = e^{-bD} \quad (1)$$

where the "b-value" $b=\gamma^2 G^2 \delta^2(\Delta-\delta/3)$. The parameter $\gamma$ is the gyromagnetic ratio and G is the amplitude of the applied diffusion magnetic field gradients. S(b) is the MR signal magnitude with diffusion weighting b, and $S_0$ is the MR signal magnitude with no diffusion weighting (b=0). The parameter D is the diffusion coefficient of the fluid (in mm²/s), which directly reflects the fluid viscosity where there are no structural restrictions to diffusion of the water. $\Delta$ is the time interval between the onsets of the two diffusion gradient lobes and $\delta$ is the duration of each gradient lobe. The diffusion coefficient D in equation (1) may be calculated, since b is known and the attenuation A can be measured.

The interpretation of attenuation A becomes complicated when water molecules are restricted in their motion by tissue structures. Different populations of water within a voxel then diffuse, on average, at different rates. One can fit the measured attenuation data with a mono-exponential function, or make an estimate of the signal decay rate using a single b-value, yielding an apparent diffusion coefficient (ADC). The ADC is useful, in detecting cytotoxic edema following a stroke.

Perfusion as related to tissue refers to the exchange of oxygen, water and nutrients between blood and tissue. The measurement of tissue perfusion is important for the functional assessment of organ health. Perfusion weighted images (PWI) which show by their brightness the degree to which tissues are perfused can be used, to assess the health of brain tissues that have been damaged by a stroke. A number of methods have been used to produce perfusion images using magnetic resonance imaging techniques. One technique, as exemplified by U.S. Pat. No. 6,295,465, is to determine the wash-in or wash-out kinetics of contrast agents such as chelated gadolinium. From the acquired NMR data, images are produced which indicate cerebral blood flow (CBF) at each voxel, cerebral blood volume (CBV) at each voxel and mean transit time (MTT) at each voxel. Each of these perfusion indication measurements provides information that is useful in diagnosing tissue health.

Several studies have noted that DWI- and PWI-derived parameter values, such as the apparent diffusion coefficient (ADC) and cerebral blood flow (CBF), vary on a voxel-by-voxel basis within the ischemic territory, and their values have been found to be associated with the likelihood of infarction. However, no single parameter has been shown to be definitively predictive of infarction, suggesting a multiparametric approach.

Models have been created to correlate the DWI and PWI measurements to tissue outcome. One such method is described by Wu et al "Predicting Tissue Outcome In Acute Human Cerebral Ischemia Using Combined Diffusion- and Perfusion-Weighted MR Imaging", Stroke, 2001; 32:933-942 and is referred to as the generalized linear model (GLM). With this predictive strategy a model is created that relates predicted outcome P (0=normal, 1=infarcted) to the DWI and PWI measurements with the logistic function:

$$P = \frac{1}{1 + e^{-\alpha + \beta x}} \quad (2)$$

where:
α=bias or intercept term that provides the base value for P if all the input parameter x are zero,
β=a vector of the coefficients used to weight each DWI and PWI parameter measurement,
x=the respective DWI and PWI parameter measurements at the voxel.

The vector β is derived from training data acquired from previous patients where the outcomes are known. As described in the above-cited publication and in co-pending U.S. patent application Ser. No. 10/182,978 entitled "Method For Evaluating Novel, Stroke Treatments Using A Tissue Risk Map" this includes selecting training regions in follow-up exams of a stroke patient population and manually selecting regions in T2 weighted images that clearly depict infarcted and noninfarcted tissues. The values from these regions in earlier acquired DWI and PWI parameter images from these same patients were used as the input vector x in the training step. The coefficients (β) are calculated using an iterative reweighted least-squares algorithm.

SUMMARY OF THE INVENTION

The present invention is an improved tissue outcome predictive model and a method for using that model to predict the outcome of ischemic tissue. More specifically, the improved model includes a parameter that indicates the voxel location with respect to the core area of the lesion. A limitation of prior models is that they fail to take into consideration the location-dependent vulnerability to infarction of a voxel. The location parameter may include a distance between the voxel and a core lesion, the location parameter may reflect the region in the brain the voxel is located, where different regions demonstrate different vulnerabilities to clinical deficits, or where the location parameter may indicate the collateral blood supply.

A discovery of the present invention is that multiparametric models can be significantly improved by taking into account location-dependent vulnerability to infarction. With a GLM model, for example, location parameters may be added as inputs:

$$P = \frac{1}{1 + e^{-\alpha + \beta x + \gamma r}} \quad (3)$$

where: γ=a vector of location parameter weighting coefficients; and
r=corresponding location parameter inputs.

Another discovery of the present invention is a location parameter that significantly increases the predictive performance of the model. More specifically, a distance parameter is calculated for each voxel that indicates its distance from the acute core lesion. As shown in FIG. 2, for example, an acute DWI region 1 is identified as the core area from which the ischemic injury extends with time. PWI parameters may define a penumbra region 2 which surrounds the core region 1 and which predicts tissue outcome according to prior methods. According to the present invention tissue outcome is also predicted by its distance from the core region 1. The voxel 3 for example, is located a distanced $d_1$ from the core 1, whereas the voxel 4 is located a distance $d_2$ from the core lesion 1. Because voxel 4 is much closer to the core lesion 1 than voxel 3, the location parameter d will predict a higher chance of infarction for point 4 than point 3.

A general object of the invention is to provide an MR imaging method that improves the tissue outcome prediction of ischemic tissue. It has been discovered that the acute region identified by DWI imaging can, and usually does, differ from the acute region identified by PWI imaging. One of the two regions will be smaller than the other and this smaller region defines the core region where both measurement techniques agree that infarction will occur. At voxels located outside this core region outcome is less certain and the present invention adds location parameters to the model to improve the outcome prediction.

The foregoing and other objects and advantages of the invention will appear from the following description. In the description, reference is made to the accompanying drawings which form a part hereof, and in which there is shown by way of illustration a preferred embodiment of the invention. Such embodiment does not necessarily represent the full scope of the invention, however, and reference is made therefore to the claims and herein for interpreting the scope of the invention.

DESCRIPTION OF THE PREFERRED EMBODIMENT

Figure 1:
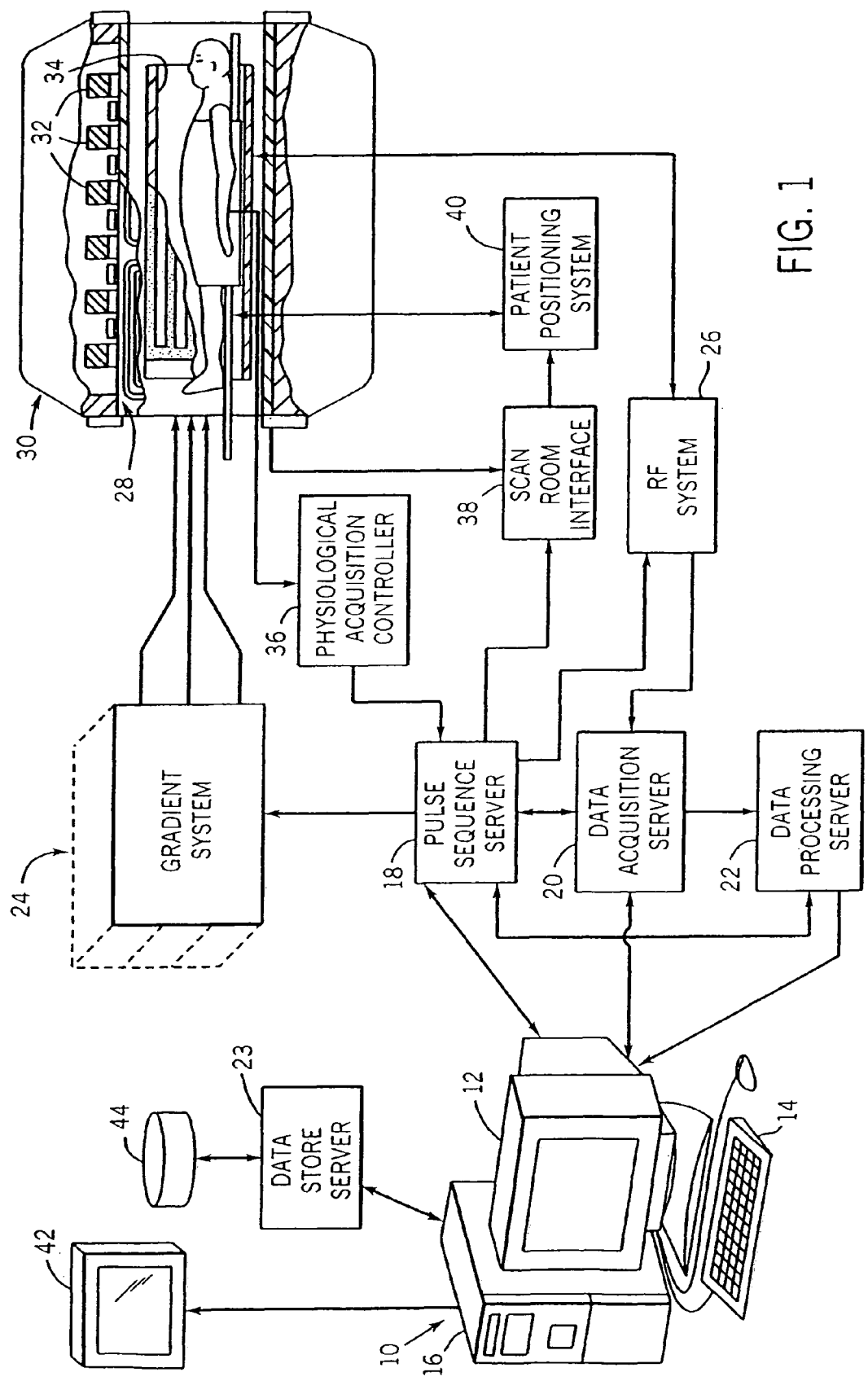
FIG. 1 is a block diagram of an MRI system which employs the present invention.

Referring particularly to FIG. 1, the preferred embodiment of the invention is employed in an MRI system. The MRI system includes a workstation 10 having a display 12 and a keyboard 14. The workstation 10 includes a processor 16 which is a commercially available programmable machine running a commercially available operating system. The workstation 10 provides the operator interface which enables scan prescriptions to be entered into the MRI system.

The workstation 10 is coupled to four servers: a pulse sequence server 18; a data acquisition server 20; a data processing server 22, and a data store server 23. In the preferred embodiment the data store server 23 is performed by the workstation processor 16 and associated disc drive interface circuitry. The remaining three servers 18, 20 and 22 are performed by separate processors mounted in a single enclosure and interconnected using a 64-bit backplane bus. The pulse sequence server 18 employs a commercially available microprocessor and a commercially available quad communication controller. The data acquisition server 20 and data processing server 22 both employ the same commercially available microprocessor and the data processing server 22 further includes one or more array processors based on commercially available parallel vector processors.

The workstation 10 and each processor for the servers 18, 20 and 22 are connected to a serial communications network. This serial network conveys data that is downloaded to the servers 18, 20 and 22 from the workstation 10 and it conveys tag data that is communicated between the servers and between the workstation and the servers. In addition, a high speed data link is provided between the data processing server 22 and the workstation 10 in order to convey image data to the data store server 23.

The pulse sequence server 18 functions in response to program elements downloaded from the workstation 10 to operate a gradient system 24 and an RF system 26. Gradient waveforms necessary to perform the prescribed scan are produced and applied to the gradient system 24 which excites gradient coils in an assembly 28 to produce the magnetic field gradients $G_x$, $G_y$, and $G_z$ used for position encoding NMR signals. The gradient coil assembly 28 forms part of a magnet assembly 30 which includes a polarizing magnet 32 and a whole-body RF coil 34.

RF excitation waveforms are applied to the RF coil 34 by the RF system 26 to perform the prescribed magnetic resonance pulse sequence. Responsive NMR signals detected by the RF coil 34 are received by the RF system 26, amplified, demodulated, filtered and digitized under direction of commands produced by the pulse sequence server 18. The RF system 26 includes an RF transmitter for producing a wide variety of RF pulses used in MR pulse sequences. The RF transmitter is responsive to the scan prescription and direction from the pulse sequence server 18 to produce RF pulses of the desired frequency, phase and pulse amplitude waveform. The generated RF pulses are applied to the whole body RF coil 34.

The RF system 26 also includes one or more RF receiver channels. The RF receiver channel is connected to a receive coil, which in the preferred embodiment is a head coil. The signal from the head coil is coupled to an RF amplifier that amplifies the NMR signal received by the coil, and a quadrature detector and analog-to-digital converter detects and digitizes the I and Q quadrature components of the received NMR signal. The magnitude of the received NMR signal may thus be determined at any sampled "k-space" point by the square root of the sum of the squares of the I and Q components:

$$M=\sqrt{I^2+Q^2}, \tag{4}$$

and the phase of the received NMR signal may also be determined:

$$\phi=\tan^{-1}Q/I. \tag{5}$$

The pulse sequence server 18 also optionally receives patient data from a physiological acquisition controller 36. The controller 36 receives signals from a number of different sensors connected to the patient, such as ECG signals from electrodes or respiratory signals from a bellows. Such signals are typically used by the pulse sequence server 18 to synchronize, or "gate", the performance of the scan with the subject's respiration or heart beat.

The pulse sequence server 18 also connects to a scan room interface circuit 38 which receives signals from various sensors associated with the condition of the patient and the magnet system. It is also through the scan room interface circuit 38 that a patient positioning system 40 receives commands to move the patient to desired positions during the scan.

It should be apparent that the pulse sequence server 18 performs real-time control of MRI system elements during a scan. As a result, it is necessary that its hardware elements be operated with program instructions that are executed in a timely manner by run-time programs. The description components for a scan prescription are downloaded from the workstation 10 in the form of objects. The pulse sequence server 18 contains programs which receive these objects and converts them to objects that are employed by the run-time programs.

The digitized NMR signal samples produced by the RF system 26 are received by the data acquisition server 20. The data acquisition server 20 operates in response to description components downloaded from the workstation 10 to receive the real-time NMR data and provide buffer storage such that no data is lost by data overrun. In some scans the data acquisition server 20 does little more than pass the acquired NMR data to the data processor server 22. However, in scans which require information derived from acquired NMR data to control the further performance of the scan, the data acquisition server 20 is programmed to produce such information and convey it to the pulse sequence server 18. For example, during prescans NMR data is acquired and used to calibrate the pulse sequence performed by the pulse sequence server 18. Also, navigator signals may be acquired during a scan and used to adjust RF or gradient system operating parameters or to control the view order in which k-space is sampled. And, the data acquisition server 20 may be employed to process NMR signals used to detect the arrival of contrast agent in an MRA scan. In all these examples the data acquisition server 20 acquires NMR data and processes it in real-time to produce information which is used to control the scan.

The data processing server 22 receives NMR data from the data acquisition server 20 and processes it in accordance with description components downloaded from the workstation 10. Such processing may include, for example: Fourier transformation of raw k-space NMR data to produce two or three-dimensional images; the application of filters to a reconstructed image; the performance of a backprojection image reconstruction of acquired NMR data; the calculation of functional MR images; the calculation of motion or flow images, etc.

Images reconstructed by the data processing server 22 are conveyed back to the workstation 10 where they are stored. Real-time images are stored in a data base memory cache (not shown) from which they may be output to operator display 12 or a display 42 which is located near the magnet assembly 30 for use by attending physicians. Batch mode images or selected real time images are stored in a host database on disc storage 44. When such images have been reconstructed and transferred to storage, the data processing server 22 notifies the data store server 23 on the workstation 10. The workstation 10 may be used by an operator to archive the images, produce films, or send the images via a network to other facilities.

Figure 3:
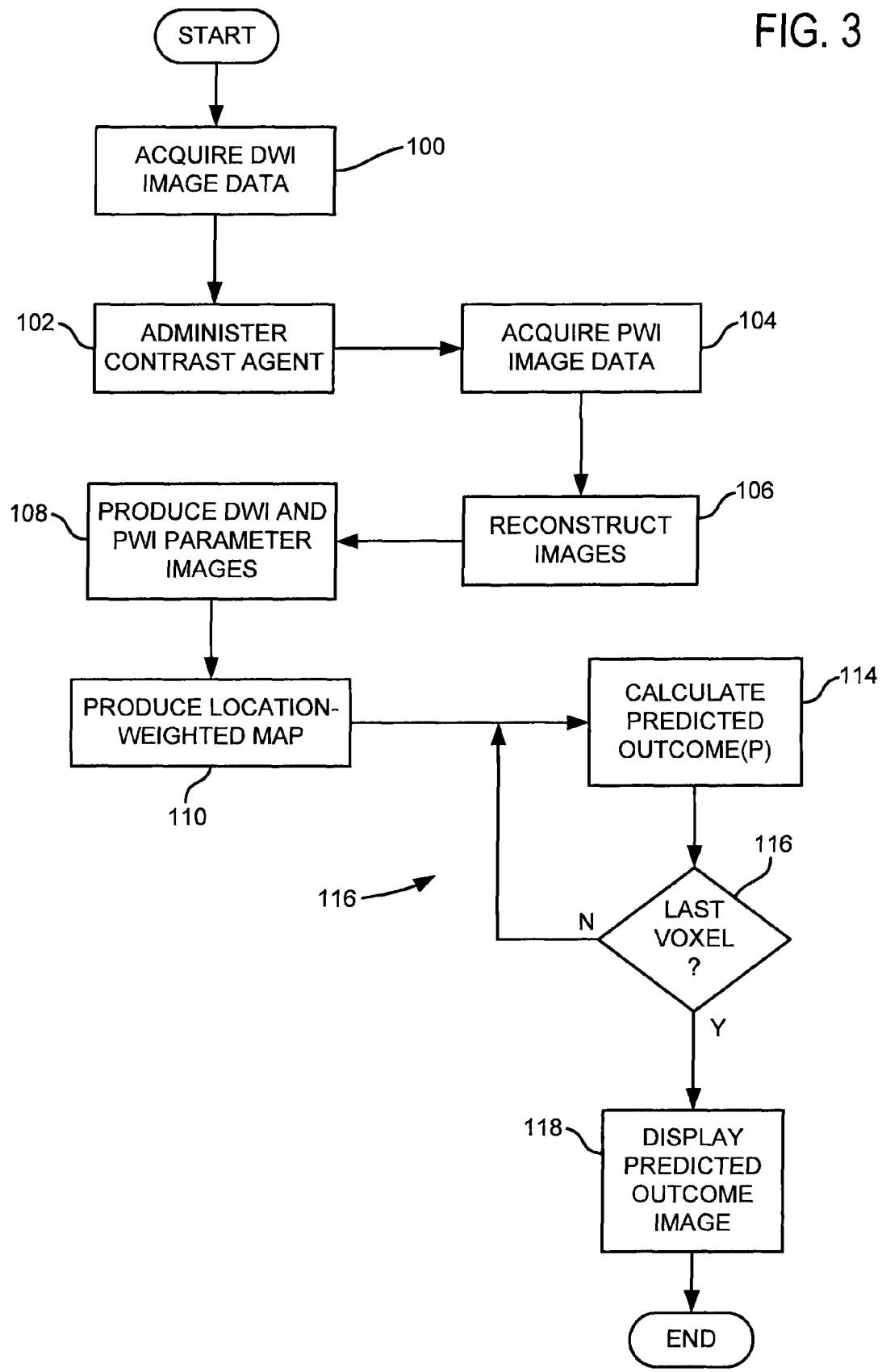
FIG. 3 is a flow chart of the steps in a preferred method for practicing the present invention.

Referring particularly to FIG. 3, the present invention is practiced on the MRI system of FIG. 1. The first step as indicated at process block 100 is to acquire NMR data from which a full diffusion tensor image can be reconstructed. Each of the six directions is acquired using a single-shot echo-planar (EPI) pulse sequence with the first moment of the motion encoding gradient waveform set to b=1000s/mm² and then repeated without motion encoding b=0. The EPI pulse sequence is a pulsed field gradient spin-echo sequence with one motion encoding gradient lobe of d-47 ms disposed to one side of the 180° RF refocusing pulse and an identical motion encoding gradient lobe is disposed to the other side of the refocusing pulse with a Δ=52 ms spacing therebetween. The TE is 118 ms and the TR is 6000. The phase encoding is stepped to sample 128 lines of k-space and 256 k-space samples are acquired from each line. A 256 by 128 array of DWI k-space data is thus acquired. Each 2D slice has a thickness of 6 mm with a 1 mm interslice gap and a field of view of 40 cm by 20 cm. The number of acquired slices depends on the extent of the brain to be examined, but typically 10 to 20 slices are acquired to cover the volume to be measured. Reference is made to the following publication for a more detailed description of the preferred DWI acquisition: Sorensen A G, Buonanno FIRST AND SECOND, Gonzalez R G, Schwamm L H, Lev M H, Huang-Hellinger F R, Reese T G, Weiskoff R M, Davis T L, Suwanwela N, Can U, Moreira J A, Copen W A, Look R B, Finklestein S P, Rosen B R, Koroshetz W J. *Hyperacute Stroke: Evaluation With Combined Multisection Diffusion-Weighted and Hemodynamically Weighted Echo-Planar MR Imaging*, Radiology, 1996; 199:391-401.

The next step as indicated at process block 102 is to administer a contrast agent to the subject of the examination. A 0.2 mmol/kg of gadolinium-based contrast agent is injected at a rate of 5 ml/s using an MRI-compatible power injector. The injection is started 10 s after commencing the PWI acquisition described below and it is followed by a comparable volume of normal saline at the same rate of 5 ml/s.

Perfusion-weighted imaging (PWI) is then performed as indicated at process block 104 starting 10 s before the contrast injection. A time series of 2D images is acquired using a spin-echo EPI pulse sequence. A total of 46 image frames are acquired from 10 to 20 slices during the first pass of the contrast agent. The size and location of the slices is substantially the same as during the DWI acquisition and PWI NMR data is acquired from the same volume of voxels. A flip angle of 90°, a TE=75 ms and a TR=1.5 s are used in the EPI pulse sequence. For a more detailed description of the PWI acquisition reference is made to the following publication: Sorensen A G, Copen W A, Ostergaard L, Buonanno FIRST AND SECOND, Gonzalez R G, Rordorf G, Rosen B R, Schwamm L H, Weisskoff R M, Koroshetz W J. *Hyperacute Stroke: Simultaneous Measurement Of Relative Cerebral Blood Volume. Relative Cerebral Blood Flow, and Mean Tissue Transit Time*, Radiology, 1999; 210:519-527.

As indicated at process block 106, the next step is to reconstruct 2D images from the acquired NMR k-space data. Each acquired DWI image data set is transformed with a two-dimensional complex fast Fourier transformation and the resulting I and Q values at each image pixel are employed to calculate the magnitude at the corresponding voxel according to the above equation (4). Six magnitude images $S_1(b)$ . . . $S_6(b)$ are thus produced. The magnitude of each voxel in the reconstructed reference image $S_0$ is also calculated.

The PWI image frames are also reconstructed using a two-dimensional complex fast Fourier transformation. Magnitude images are produced from the resulting I and Q values at each image pixel according to the above equation (4). The magnitude of the NMR signal at each voxel is thus calculated for the 46 image frames. The resulting 46 values in the time course data at each voxel indicates the change in NMR signal magnitude during the first pass of the contrast agent.

As indicated at process block 108 the DWI and PWI parameter images are calculated next. An apparent diffusion coefficient (ADC) image is calculated with the DWI phase difference images. As is well known in the art, this is done by calculating the diffusion coefficient (D) for each of the six motion encoding directions using the magnitude images $S_1(b)-S_6(b)$, the reference magnitude $S_0$ and the above equation (1). From these six diffusion coefficients $D_1-D_6$ the ADC is calculated.

A number of parameter images are calculated from the PWI time course image frames. For each image pixel a concentration vs. time curve is calculated first from the time course NMR signal magnitude values. Integrating the concentration curve over time yields a cerebral blood volume (CBV) value at each image pixel. Cerebral blood flow (CBF) is then computed using deconvolution techniques, and from the central volume theorem, the mean transit time (MTT) is then calculated at each voxel:

$$MTT=CBV/CBF.  \qquad(6)$$

The DWI and PWI parameters for each voxel form a vector x for use in the predicted outcome calculation below.

The next step in the process as indicated at process block 110 is to produce a location-weighted map which provides one or more location parameter inputs r for each voxel. A detailed description of the preferred method for producing the location-weighted map is described in detail below with reference to FIG. 4. The location weighted map provides the location parameter value(s) at each voxel that form the vector r in the predicted outcome calculations below.

Referring still to FIG. 3, after all the input parameter vectors x and r are calculated, a loop is entered at 112 in which the outcome (P) of the tissue at each voxel is predicted. As indicated at process block 114, the x and r parameter values for one voxel are input to the GLM model expressed above in equation (3) and the prediction (P) is calculated for that voxel. This step is repeated for each voxel in the examined region until predictions for every voxel have been calculated as indicated at decision block 116. These predictions (P) are displayed as an image in which each prediction value P color codes its corresponding image pixel. This image is displayed as indicated at process block 118, and if a pixel is selected by moving a cursor and "clicking" a mouse button, the numeric prediction value (P) at the selected location is displayed. Commands may also be entered to select voxels with a prediction value P greater than a specified value, or between specified values. The voxels selected in this manner are highlighted on the image to facilitate the evaluation of clinical outcome.

In tests conducted with and without the inclusion of this spatial information it was found that a substantial and significant improvement in predictive ability is achieved with the present invention. The DWI and PWI only GLM resulted in an area under the curve ("AUC") of 0.75±0.13 (mean±SD across patients) whereas the inclusion of spatial information increased the mean AUC to 0.83±0.14, a significant improvement (p=0.00096). An example of this improved sensitivity is shown in FIG. 5 where the AUC 120 for location+DWI+PWI weighting is 0.846 and the AUC of the DWI+PWI weighting curve 122 is 0.712. The sensitivity of the location+DWI+PWI weighting exceeds that of the DWI+PWI only weighting at all false positive ratios. For the clinically acceptable range of false positive ratios (i.e., 0 to 0.3, corresponding to specificity ranging from 100 to 70%), the MRI-only weighted GLM according to the present invention had a maximum sensitivity of 68±22% (which occurred at a false positive ratio of 0.3, specificity=70%), whereas the Spatial plus MRI weighted GLM had a maximum sensitivity of 79±23%, a significant improvement (p=0.0029, n=75).

Figure 2:
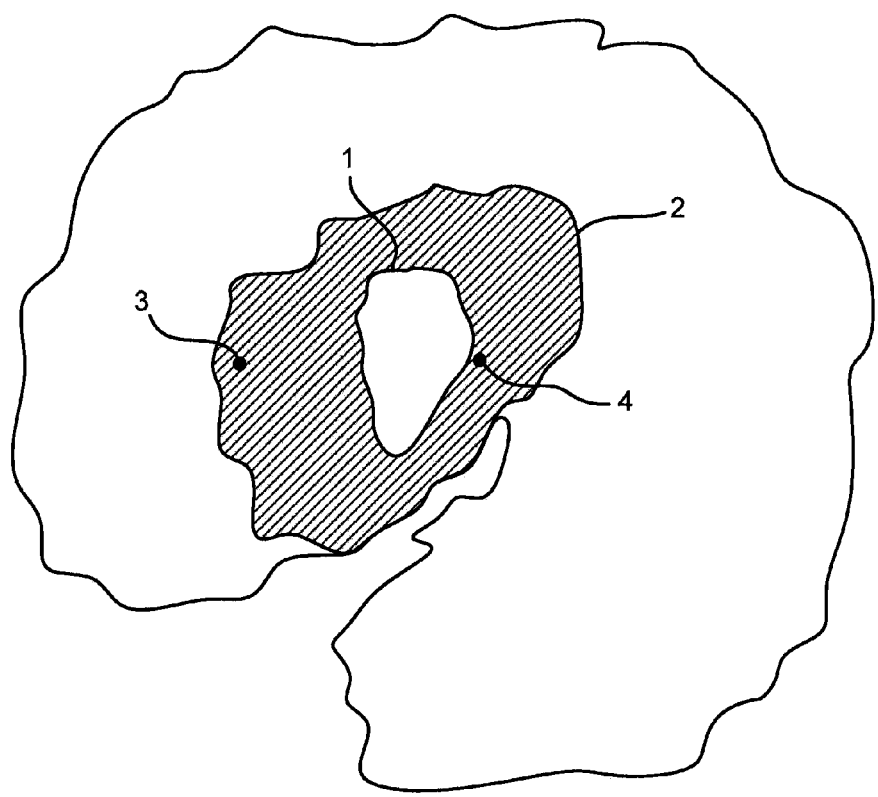
FIG. 2 is a schematic representation of the human brain illustrating the spatial progression of ischemic injury.
Figure 4:
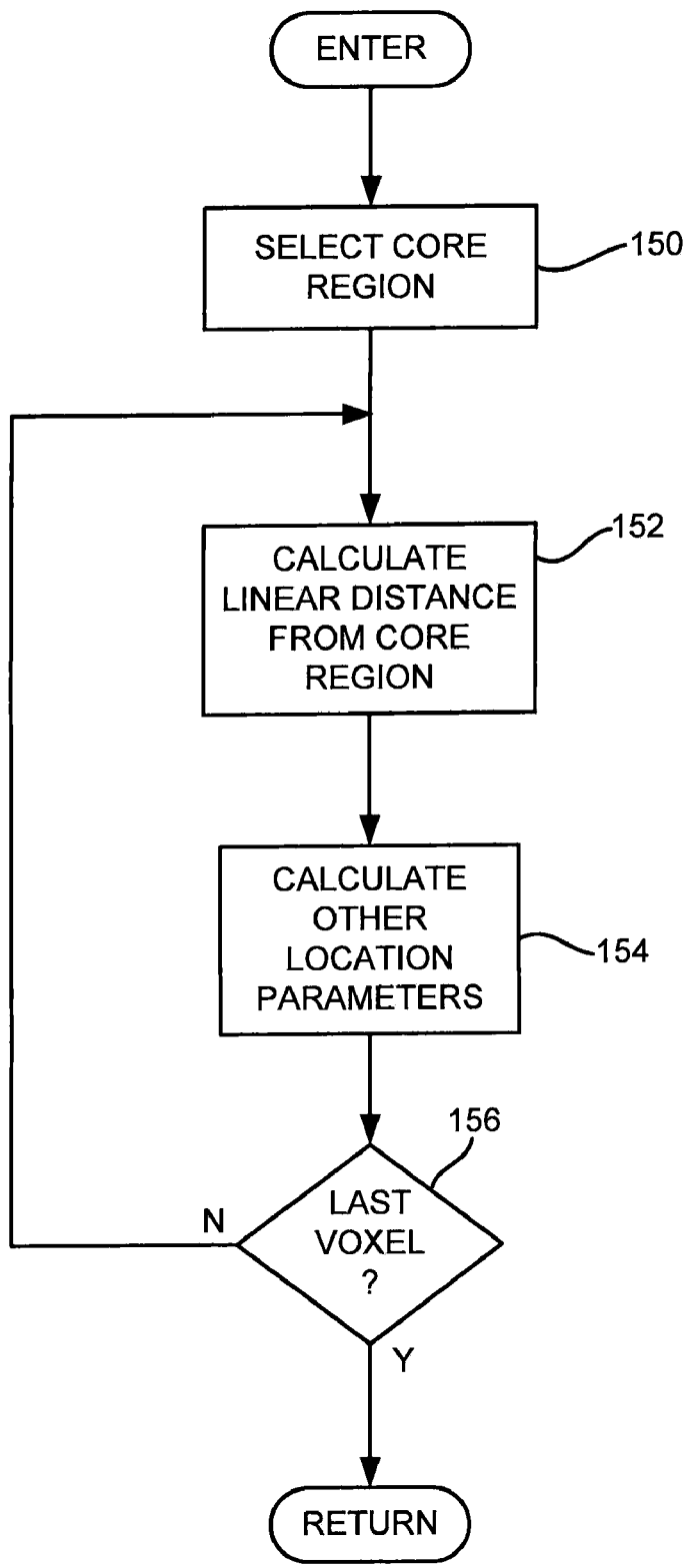
FIG. 4 is a flow chart of the steps used in the preferred embodiment for producing the location-weighted map that forms part of the method in FIG. 3

Referring now to FIG. 4, the location weighted map which provides the inputs to the enhanced GLM model can be produced in a number of different ways. In the preferred embodiment a single location parameter is produced for each voxel that indicates the distance of the voxel from the core region 1 shown in FIG. 2. The first step, therefore, is to identify the core region 1 as indicated at process block 150. This can be done automatically by selecting voxels from the smaller of the PWI acute region or the DWI acute region. The "acute region" is those voxels having either PWI or DWI values that indicate current cell death due to ischemia. In the alternative, a core region 1 can be manually selected. Where no acute region is found, which occurs in about 5% of cases, the location of the centroid of the MTT lesion is selected as the core region.

As indicated at process block 152, a linear distance parameter is calculated for each voxel in the larger region 2. This parameter (L) is the Euclidean distance in three dimensions from the voxel location ($V_{x,y,z}$) to the nearest voxel ($V_{x_c}$, $V_{y_c}$, $V_{z_c}$) in the core region 1:

$$L = \sqrt{(V_x - V_{x_c})^2 + (V_y - V_{y_c})^2 + (V_z - V_{z_c})^2}. \quad (7)$$

This linear distance parameter L is stored in a 3D array at a location that corresponds to the location of the voxel.

Other location parameters may also be calculated for the voxel as indicated by process block 154. For example, the brain may be segmented into regions that have different responses to the ischemic cascade initiated by a stroke. If the voxel lies in one region of the brain, for example, it is assigned a higher value location parameter than a voxel located in another region of the brain.

Possible variations on the preferred embodiment is to replace the linear distance parameter L with one that is measured by the distance squared from the core region 1 or by one over the distance from the core region 1.

After the location parameters have been calculated for all the voxels as determined at decision block 156, the resulting location-weighted map is returned for inclusion in the predicted outcome calculation discussed above.

The modified GLM of equation (3) used to practice the preferred embodiment of this invention includes weighting coefficients β and γ that must be determined from training data acquired from a pool of previous patients where the outcomes are known. As described in the above-cited publication and co-pending U.S. patent application Ser. No. 10/182,978, this includes selecting training regions in follow-up exams of a stroke patient population and manually selecting regions in T2 weighted images that clearly depict infarcted and noninfarcted tissues. The values from DWI and PWI parameter images as well as the location-weighted map from these same patients were used as the input vectors x and r in the training process. The coefficients (β) and (γ) are then calculated using an iterative reweighted least-squares algorithm.

The invention claimed is:

1. A method for predicting tissue fate, the steps comprising:
   a) imaging tissues with a magnetic resonance imaging (MRI) system;
   b) acquiring data from the tissues with the system that contains information indicative of a physiological parameter related to tissue health;
   c) reconstructing an image of the tissues form the acquired data;
   d) calculating from the acquired data a physiological parameter at tissue locations in the reconstructed image;
   e) selecting a core region in the reconstructed image;
   f) calculating a location parameter related to the distance of each of said tissue locations from the core region, the location parameter being equal to the distance of the tissue location form the core region; and
   g) predicting the fate of tissues at each of said tissue locations using a predetermined model that employs as inputs the physiological parameter and the location parameter.

2. The method as recited in claim 1 in which the predetermined model is a generalized linear model of the form:

$$P = \frac{1}{1 + e^{-\alpha + \beta x + \gamma r}}$$

in which P is the predicted outcome, x is the physiological parameter, r is the location parameter, β is a coefficient that weights the physiological parameter, γ is a coefficient that weights the location parameter, and α is a bias term.

3. The method as recited in claim 1 in which the tissues are located in a mammalian brain.

4. The method as recited in claim 1 in which step a) includes acquiring a diffusion weighted image.

5. The method as recited in claim 4 in which a plurality of diffusion weighted images are acquired with motion encoding gradients oriented in respective different directions.

6. The method as recited in claim 5 in which the physiological parameter calculated in step d) includes apparent diffusion coefficient (ADC) calculated from the plurality of diffusion weighted images.

7. The method as recited in claim 1 in which step b) includes acquiring a set of perfusion weighted image frames.

8. The method as recited in claim 7 in which step d) includes calculating a plurality of physiological parameters from said set of perfusion weighted image frames, and in which the predetermined model accepts said plurality of physiological parameters as inputs to the prediction.

9. The method as recited in claim 8 in which step b) includes acquiring a diffusion weighted image, and in which step d) includes calculating a diffusion coefficient at each tissue location from the acquired diffusion weighted image.

10. The method as recited in claim 1 in which step e) is performed by manually selecting the core region in the image reconstructed in step c).

11. The method as recited in claim 1 in which step e) is performed by selecting tissue locations based on the physiological parameter values calculated in step d).

12. The method as recited in claim 1 wherein step g) further includes employing an additional location parameter indicative of the region of the subject being imaged in which the tissues lie when predicting the fate of tissues using the predetermined mode.

* * * * *

UNITED STATES PATENT AND TRADEMARK OFFICE
CERTIFICATE OF CORRECTION

| | | |
|---|---|---|
| PATENT NO. | : 7,904,135 B2 | Page 1 of 1 |
| APPLICATION NO. | : 11/417769 | |
| DATED | : March 8, 2011 | |
| INVENTOR(S) | : Nina Menezes | |

It is certified that error appears in the above-identified patent and that said Letters Patent is hereby corrected as shown below:

Column 4, line 20, "distanced" should be --distance--.

Column 10, line 4, claim 1, "form" should be --from--.

Column 10, line 12, claim 1, "form" should be --from--.

Signed and Sealed this
Nineteenth Day of April, 2011

David J. Kappos
*Director of the United States Patent and Trademark Office*